United States Patent [19]
Kokubo et al.

[11] Patent Number: 6,037,839
[45] Date of Patent: Mar. 14, 2000

[54] BTL AMPLIFYING CIRCUIT

[75] Inventors: Kenichi Kokubo, Ota; Koji Tatani; Takayuki Taira, both of Gunma-Ken, all of Japan

[73] Assignee: Sanyo Electric Co., Ltd., Osaka, Japan

[21] Appl. No.: 09/179,214

[22] Filed: Oct. 27, 1998

[30]  Foreign Application Priority Data

Oct. 31, 1997  [JP]  Japan .................................... 9-300563

[51] Int. Cl.$^7$ ........................................................ H03F 3/18
[52] U.S. Cl. ........................................... 330/263; 330/267
[58] Field of Search .................................... 330/263, 267, 330/268, 146; 381/120

[56] References Cited

U.S. PATENT DOCUMENTS

| 4,355,287 | 10/1982 | Hoover | 330/264 |
| 4,910,477 | 3/1990 | Gross | 330/263 |

FOREIGN PATENT DOCUMENTS

| 3436247 A1 | 4/1986 | Germany | 330/146 |

*Primary Examiner*—Benny Lee
*Assistant Examiner*—Henry Choe
*Attorney, Agent, or Firm*—Cantor Colburn LLP

[57]  ABSTRACT

When first and fourth output transistors (15) and (18) are turned on, the voltage at the connecting point between the first and second driving transistors (19) and (20) drops. When second and third output transistors (16) and (17) are turned on, the voltage at the connecting point between third and fourth driving transistors (21) and (22) drops. As a result, voltage differences between the collectors and emitters of the first and second input transistors (2), (3) and the first and second current source transistors (13) and (14) increase so that saturation of the first and second current source transistors (13) and (14) can be prevented. Since a resistor is connected between a connecting point between upper and lower output transistors and a connecting point between upper and lower driving transistors having inverted phases from the former two transistors, current is limited and oscillation can be prevented.

3 Claims, 3 Drawing Sheets

BTL AMPLIFYING CIRCUIT

BACKGROUND OF THE INVENTION

1. Field of the Invention

The present invention relates to a balanced transformer less (BTL) amplifying circuit which prevents saturation of a transistor to achieve a large output.

2. Description of the Related Art

Conventionally, BTL amplifying circuits are known as electric power amplifying circuits which generate, using input audio signals, signals having mutually inverted phases for use in BTL-driving a load. A typical BTL circuit has a structure as is shown in FIG. 3.

Referring to FIG. 3, the connection point a between driving transistors 4, 5 and the connection point b between output transistors 6, 7 are commonly connected, while the connection point c between driving transistors 8, 9 and the connection point d between output transistors 10, 11 are commonly connected.

With the above structure, when an input amplifier 1 receives a negative input signal, a negative signal is supplied to a first input transistor 2, while a positive signal is supplied to a second input transistor 3. In response to the supplied negative signal, the first input transistor 2 is turned off, upon which the driving transistor 4 is turned on and the driving transistor 5 is turned off. Further, the output transistor 6 is turned on and the output transistor 7 is turned off. In response to the supplied positive signal, the second input transistor 3 is turned on, upon which the driving transistor 8 is turned off and the driving transistor 9 is turned on. Further, the output transistor 10 is turned off and the output transistor 11 is turned on. As a result, an output current flows through the output transistor 6, a load 12, and the output transistor 11 in this order.

On the other hand, when an input amplifier 1 receives a positive input signal, a positive signal is supplied to the first input transistor 2, while a negative signal is supplied to the second input transistor 3. In response to the supplied positive signal, the first input transistor 2 is turned on, upon which the driving transistor 4 is turned off and the driving transistor 5 is turned on. Further, the output transistor 6 is turned off and the output transistor 7 is turned on. In response to the supplied negative signal, the second input transistor 3 is turned off, upon which the driving transistor 8 is turned on and the driving transistor 9 is turned off. Further, the output transistor 10 is turned on and the output transistor 11 is turned off. As a result, an output current flows through the output transistor 10, the load 12, and the output transistor 7 in this order.

As described above, the load 12 is BTL-driven by an output current flowing through either the output transistor 6, the load 12, and the output transistor 11 or the output transistor 10, the load 12, and the output transistor 7 in respective orders.

A saturation voltage on the power source voltage side of the BTL amplifying circuit shown in FIG. 3 is determined at the largest one of the Vce6(sat), Vce4(sat)+Vbe6, and Vbe4+Vce13(sat), wherein Vce6(sat), Vce4(sat), and Vce13 (sat) are collector-emitter saturation voltages of the output transistor 6, the driving transistor 4, and the current source transistor 13, respectively, and Vbe6 and Vbe4 are base-emitter voltages of the output transistor 6 and the driving transistor 4, respectively. Here, since the output transistor 6 is set with large current supplying capacity in order to drive a load, the output transistor 6 resultantly has a large size.

Since collector-emitter saturation voltage Vce(sat) of a transistor become smaller with an increasing size of the transistor, when the transistor 6 has a large size, Vce6(sat) and Vbe6 thereof becomes smaller then Vbe4+Vce13(sat) becomes the largest among the aforementioned three voltages. Therefore, the saturation voltage on the power source voltage side of the BLT amplifying circuit is determined at Vbe4+Vce13(sat). Based on a similar concept, the saturation voltage on the power source voltage side of the third and fourth output transistors 10 and 11 are determined according to the base-emitter voltage Vbe8 of the driving transistor 8 and the collector-emitter saturation voltage Vce14(sat) of the current source transistor 14, respectively.

When the saturation voltage of a BTL amplifying circuit is determined as above, the upper limit of the swing of an output signal is determined at a value lower than the power source voltage Vcc by Vbe4+Vce13(sat), while the lower limit thereof is determined at a value higher than the earth level by Vbe8+Vce14(sat). As Vbe+Vce(sat) is not negligible compared to the power source voltage Vcc, the full-swing level of an output signal from the BTL amplifying circuit is remarkably limited. This hinders an increase of an output of a BTL amplifying circuit to achieve a BTL amplifying circuit with a large output.

SUMMARY OF THE INVENTION

According to the present invention, when the first and fourth output transistors are turned on, the voltage at the connecting point between the first and second driving transistors drops. On the other hand, when the second and the third output transistors are turned on, the voltage at the connecting point between the third and fourth driving transistors drops. Therefore, the voltage difference between the collector and emitter voltages of a first current source transistor and that of a second current source transistor can be increased. Further, since first and second resistors are connected, the amount of current flowing between the connecting point between the first and second output transistors and that between the third and fourth driving transistors, and the amount of current flowing between the connecting point between the third and fourth output transistors and that between the first and second driving transistors can be limited.

As described above, since the saturation voltage of a BTL amplifying circuit can be determined according to the collector-emitter saturation voltage of an output transistor, the full-swing level of an output signal from the BTL amplifying circuit can be enlarged. This enables achievement of a BLT amplifying circuit with a large output. Further, in particular, since integration results in enlarging the size of the output transistor, the collector-emitter voltage resultantly becomes large. This enables achievement of a still larger output. Still further, since the connection point of output transistors and that of driving transistors are connected via a resistor, oscillation can be prevented.

Yet further, since a resistor is connected between connecting points of driving transistors, variation of idling current flowing into the driving transistors can be suppressed. This can advantageously prevent deterioration of a distortion rate of an output signal from the BTL amplifying circuit.

BRIEF DESCRIPTION OF THE DRAWINGS

The above and other objects, features, and advantages, will become further apparent from the following description of the preferred embodiment taken in conjunction with the accompanying drawings wherein.

DESCRIPTION OF THE PREFERRED EMBODIMENTS

Figure 1:
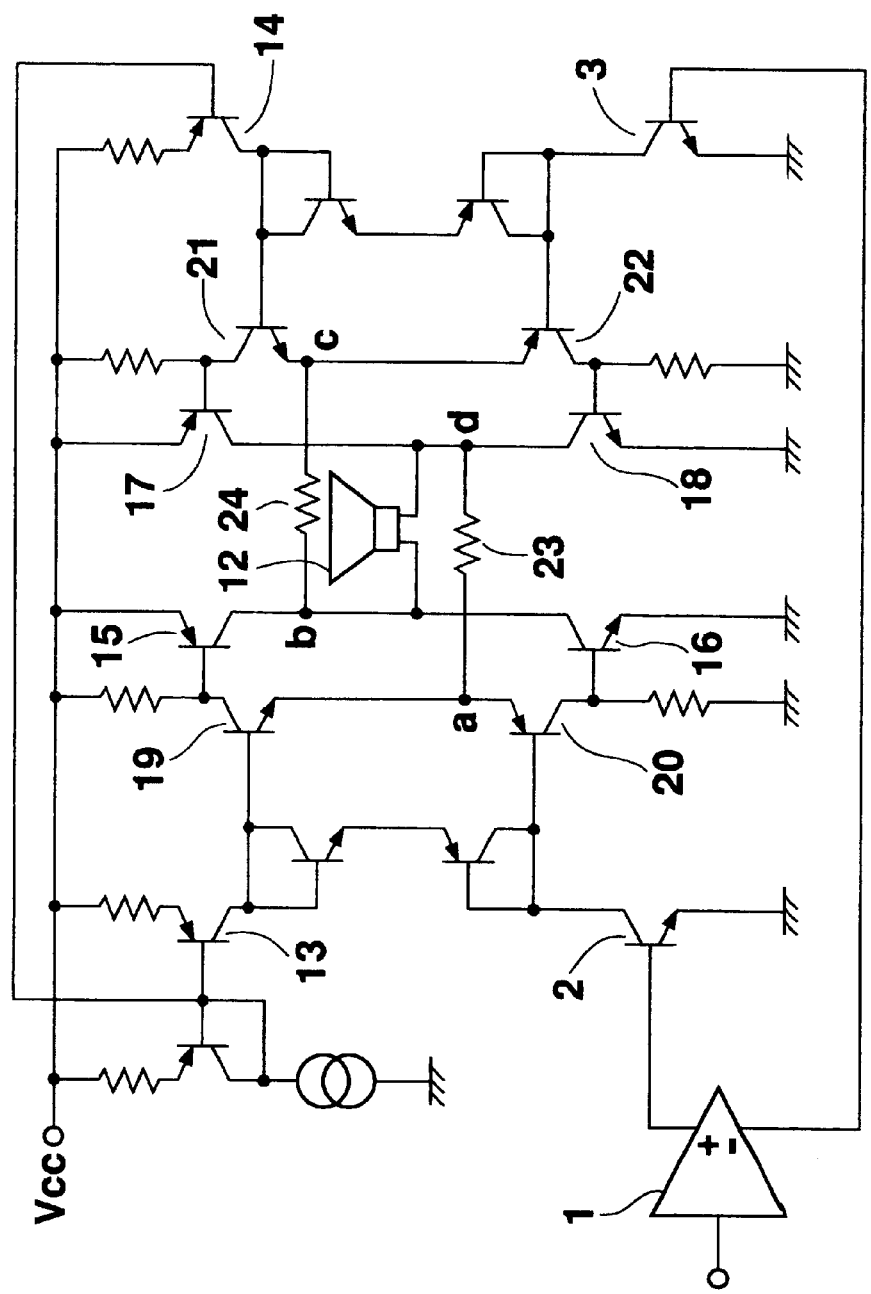
FIG. 1 is a diagram showing a circuit according to a preferred embodiment of the present invention.
Figure 3:
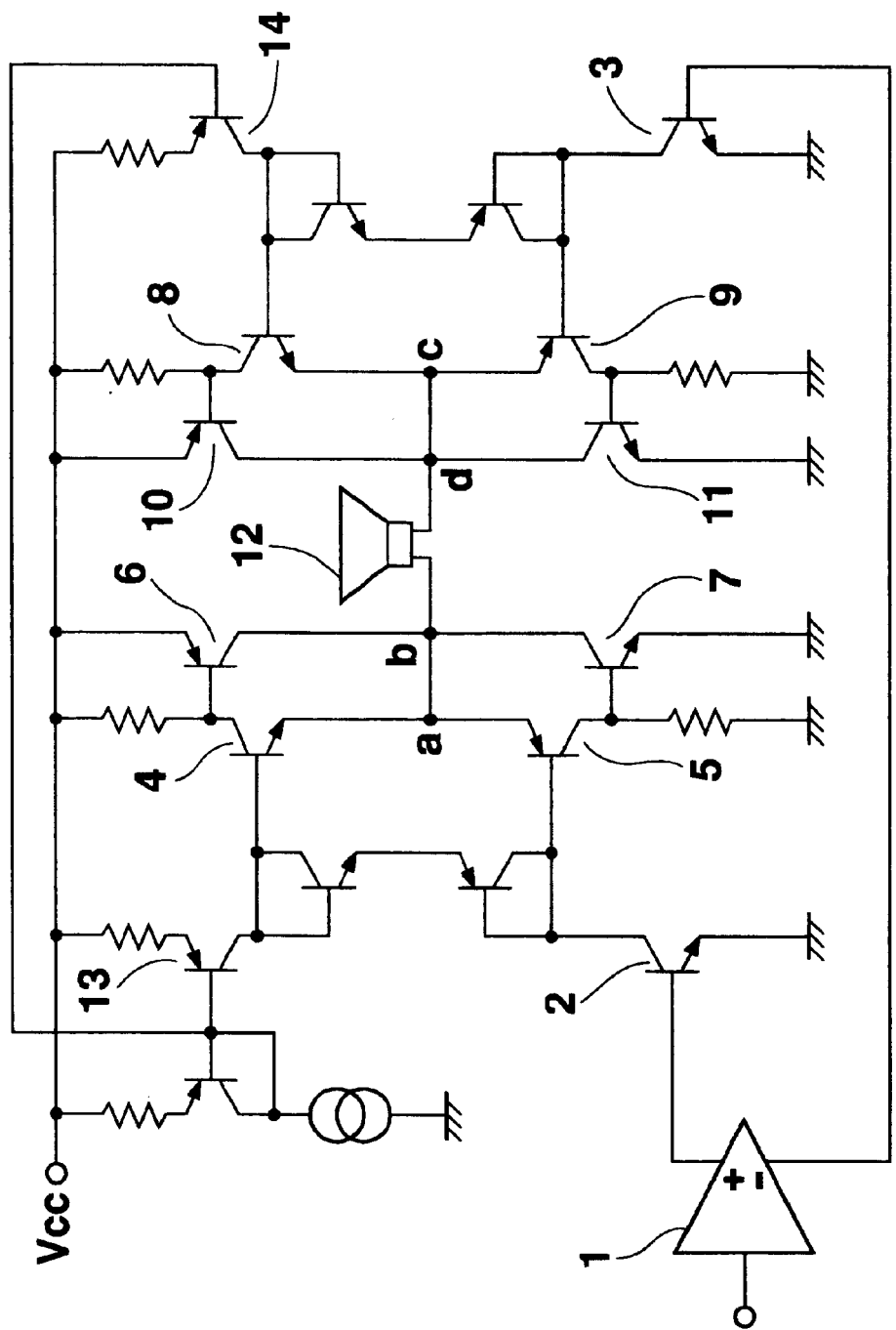
FIG. 3 is a diagram showing prior art.

Referring to FIG. 1, which shows a first preferred embodiment of the present invention, first and second output transistors 15, 16 are SEPP (single ended push pull) connected, and the third and fourth output transistors 17, 18 are also SEPP connected. The first and second output transistors 15, 16 are driven by first and second driving transistors 19 and 20, respectively, which are connected at a point a and the connecting point a is connected to the connection point d of the third and fourth output transistors 17, 18. The third and fourth output transistors 17, 18 are driven by third and fourth driving transistors 21, 22, respectively, which are connected at a point c and the connecting point c is connected to the connection point b of the first and second output transistors 15, 16. A resistor 23 is connected between the connecting points a and d for limiting the current flowing between them. A resistor 24 is connected between the connecting points b and c for limiting the current flowing between them. Note that elements corresponding to those in FIG. 3 are given identical reference numerals.

Receiving a negative input signal, the amplifier 1 outputs a signal, upon which the first input transistor 2 is turned off and the second input transistor 3 is turned on. Similar to the operation described with reference to FIG. 3, the first and fourth output transistors 15, 18 are then turned on.

In the example shown in FIG. 1, since the connecting point a between the first and second driving transistors 19, 20 is connected to the connecting point d between the third and fourth output transistors 17, 18, the collector voltage thereof becomes closer to the earth level when the fourth output transistor 18 is turned on. Accordingly, the emitter voltage of the first driving transistor 19 also becomes closer to the earth level. With the emitter voltage of the first driving transistor 19 at the closer level to the earth level, the base voltage of the transistor 19 becomes higher than the value closer to the earth level by Vbe19, Vbe19 being a base-emitter voltage of the first transistor 19. As a result, the voltage difference between the collector and the emitter of the first current source transistor 13 enlarges, so that the first current source transistor 13 becomes unlikely to be saturated.

Also, since the connecting point c between the third and fourth driving transistors 21, 22 is connected to the connecting point b between the first and second output transistors 15, 16, the emitter voltage of the fourth transistor 22 becomes closer to the power source voltage Vcc when the first output transistor 15 is turned on. Therefore, providing that the base-emitter voltage of the fourth driving transistor 22 is Vbe22, the collector voltage of the second input transistor 3 becomes lower than the voltage closer to the power voltage Vcc by Vbe22. As a result, the voltage difference between the collector and the emitter of the second input transistor 3 enlarges, so that the second input transistor 13 becomes unlikely to be saturated.

With a larger negative input signal applied to the amplifier 1, the collector voltage of the fourth output transistor 18 becomes much closer to the earth level, and that of the first output transistor 15 becomes much closer to the power voltage Vcc. This results in enlarging the voltage difference between the collector and emitter voltages of the first current source transistor 13 and that of the second input transistor 3. As a result, the first current source transistor 13 and the second input transistor 3 become unlikely to be saturated.

Also, since a larger output current flows across the load 12 in response to a larger input signal, the voltage at the load 12 drops. Accordingly, the collector voltage of the first output transistor 15 increases, while the collector voltage of the fourth output transistor 18 drops. This results in reducing the differences between the collectors and emitters of the first and fourth output transistors 15 and 18. When the differences become smaller than the collector-emitter saturation voltages of the first and fourth output transistors 15 and 18, respectively, the first and fourth output transistors 15 and 18 are saturated. Therefore, in the case of a negative input signal, the saturation voltage of the BTL amplifying circuit shown in FIG. 1 is determined according to the collector-emitter saturation voltages of the first and fourth output transistors 15 and 18.

On the contrary, when a positive input signal is input to the input amplifier 1, the amplifier 1 outputs a signal, upon which the first input transistor 2 is turned on and the second input transistor 3 is turned off. Accordingly, the second and third output transistors 16 and 17 are turned on.

Here, since the connecting point c between the third and fourth driving transistor 21 and 22 is connected to the connecting point b between the first and second output transistors 15 and 16, the collector voltage of the second output transistor 16 becomes closer to the earth level when the second output transistor 16 is turned on. Accordingly, the emitter voltage of the third driving transistor 21 also becomes closer to the earth level, upon which the base voltage thereof becomes higher than the value closer to the earth by Vbe21. Note that Vbe21 is a base-emitter voltage of the third driving transistor 21. Therefore, a voltage difference between the collector and the emitter of the second current source transistor 14 enlarges.

Also, since the connecting point a between the first and second driving transistor 19 and 20 is connected to the connecting point d between the third and fourth output transistors 17 and 18, the emitter voltage of the second driving transistor 20 becomes closer to the power voltage Vcc when the third output transistor 17 is turned on. Therefore, assuming that the base-emitter voltage of the second driving transistor 20 is as Vbe22, the collector voltage of the first input transistor 2 becomes lower than the voltage closer to the power voltage Vcc by Vbe20. As a result, a voltage difference between the collector and the emitter of the second input transistor 2 enlarges, so that the first input transistor 2 becomes unlikely to be saturated.

With a larger positive input signal, the collector voltage of the second output transistor 16 becomes closer to the earth level, while the collector voltage of the third output transistor 17 becomes closer to the power source voltage Vcc. As a result, voltage differences between the collectors and the emitters of the second driving transistor 14 and the first input transistor 2 further enlarge, so that the second driving transistor 14 and the first input transistor 2 become further unlikely to be saturated.

Also, since a larger output current flows across the load 12 in response to a larger input, the voltage at the load 12 drops. Accordingly, the collector voltage of the third output transistor 17 increases, while the collector voltage of the second output transistor 16 drops. As a result, the voltage differences between the collectors and the emitters of the second and third output transistors 16, 17 are reduced. When the voltage differences become smaller than the collector-emitter saturation voltages of the second and the third output transistors 16 and 17, respectively, the second and third output transistors 16 and 17 are saturated. Therefore, in the case of a positive input signal, the saturation voltage of the BTL amplifying circuit shown in FIG. 1 is determined according only to the collector-emitter saturation voltages of the second and third output transistors 16 and 17.

It can also be seen in FIG. 1 that resistors 23 and 24 are connected for current limitation. With a negative input signal applied, the resistors 24 and 23 limit the current flowing from the connection point b to the connection point c and from the connection point a to the connection point d, respectively. With a positive input signal applied, on the contrary, they limit the current flowing from the connection point c to the connection point b and from the connection point a to the connection point a.

Here, when either a positive or negative input signal is applied, the current flowing between the connection points a–d and between b–c varies with the same phases. If these points are shorted without providing the resistors 23 and 24, the current flowing between these points will vary remarkably with the same phases. This may cause to increase a base current to be supplied to the output transistors, and thus a current flowing in the output transistors. This results in causing oscillation to the amplifying circuit of FIG. 1.

In order to solve this problem, the resistors 23, 24 are provided to limit the current flowing between respective connection points so that a steady current can be supplied to the output transistors. This can resultantly prevent oscillation.

Note that if the resistance of resistors 23 and 24 is too small, they will not prevent oscillation, while those with too large values would hinder enlargement of the range of saturation voltages of the BTL amplifying circuit through voltage drop. Therefore, the resistances of the resistors 23, 24 are preferably set at a value which can at least prevent oscillation.

Figure 2:
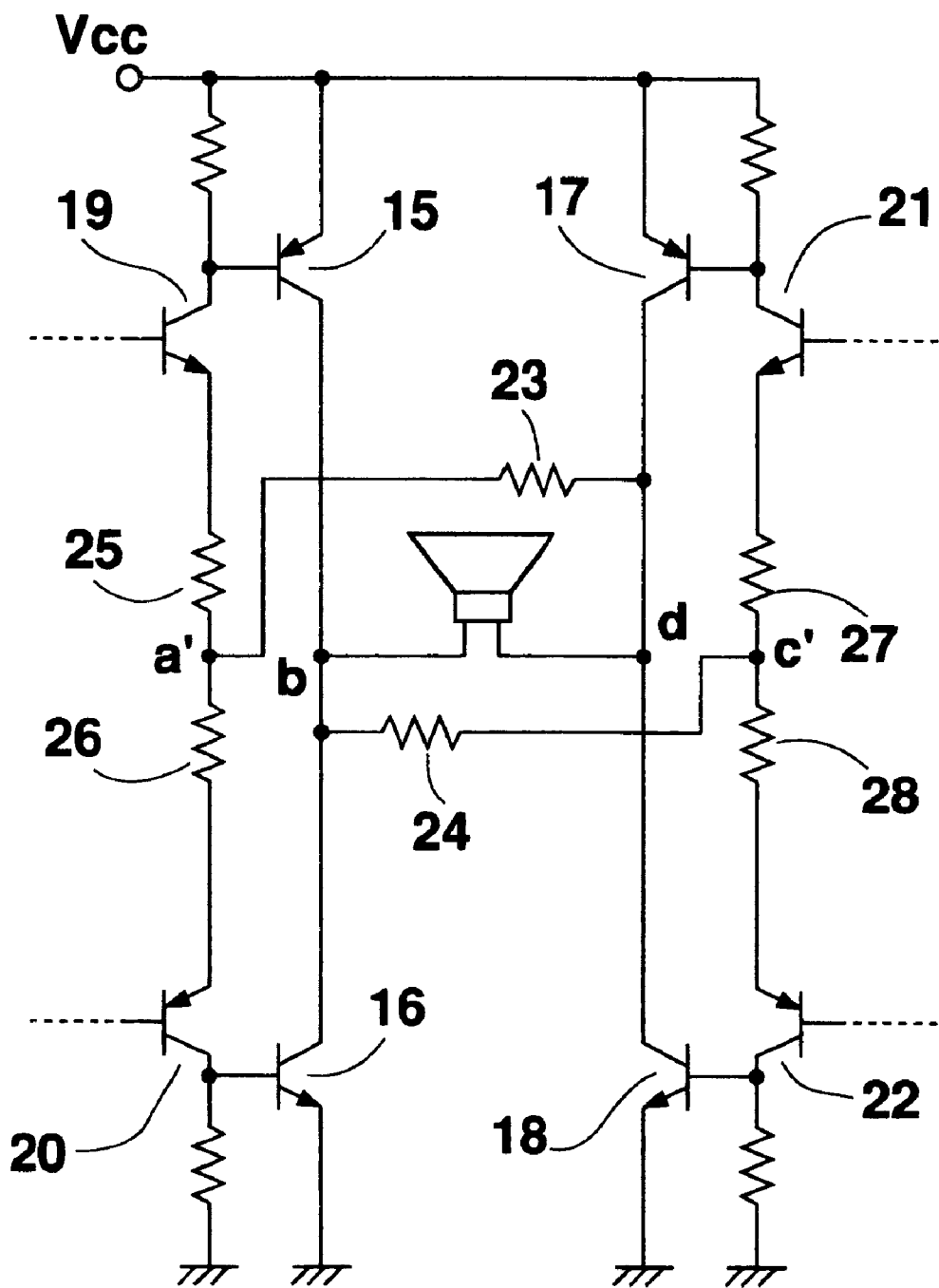
FIG. 2 is a diagram showing a circuit according to another preferred embodiment of the present invention.

Referring to FIG. 2, which shows a second preferred embodiment of the present invention, resistors 25 and 26 are connected between the emitters of the first and second driving transistors 19 and 20 for controlling an idling current; and resistors 27 and 28 are connected between the emitters of the third and fourth transistors 21 and 22 for controlling an idling current. The connecting point a' between the resistors 23 and 24 is connected via a resistor 23 to the connecting point d, while connecting point c' between the resistors 27 and 28 is connected via the resistor 24 to the connecting point b.

When the first and fourth output transistors 15 and 18 are in an on-state, the emitter current of the first driving transistor 19 flows via the resistor 25 to the fourth output transistor 18. As a result, the base voltage of the first driving transistor 19 increases, and the current flowing the first and fourth output transistors 15, 18 thus also increases. This further causes to increase the emitter current of the first transistor 19. Accordingly, the base-emitter voltage of the first driving transistor 19 tends to increase. With the emitter current of the transistor 19 increased, however, the voltage at the resistor 25 drops, and the emitter voltage of the first driving transistor 19 thus increases at a ratio substantially equal to that at which the base voltage thereof increases. Thus, the voltage difference between the base and the emitter of the first driving transistor 19 remains the same, and the emitter current thereof 19 will not increase.

On the other hand, the collector current of the first output transistor 15 partly flows via the resistor 28 to the fourth driving transistor 22. Then, the base voltage of the fourth driving transistor 22 drops, and the emitter current thereof tends to increase. When a current to flow to the resistor 38 tends to increase, the voltage at the resistor 28 drops, and the emitter voltage of the fourth driving transistor 22 thereby drops. As a result, the voltage difference between the emitter and the base of the fourth driving transistor 22 remains the same, and the emitter current thereof will not increase.

When the second and third output transistors 16 and 17 are in an on state, the base voltage of the third driving transistor 21 increases, and the emitter current thereof tends to increase. When a current to flow to the resistor 27 tends to increase, the voltage at the resistor 27 drops, and the emitter voltage of the third driving transistor 21 thereby increases. As a result, the voltage difference between the emitter and the base of the third driving transistor 21 remains the same, and the emitter current thereof will not increase.

When the base voltage of the second driving transistor 20 drops, the emitter current thereof tends to increase. When a current flowing to the resistor 26 increases, the voltage at the resistor 26 drops, and the emitter voltage of the second driving transistor 20 thereby drops. As a result, the voltage difference between the emitter and the base of the second driving transistor 20 remains the same, and the emitter current thereof will not increase.

As described above, employment of the resistors 25 to 28 can prevent variation of the emitter current of the respective driving transistors. This enables to prevent variation of an idling current and to achieve additional advantage of preventing deterioration of a distortion ratio of an output signal from a BTL amplifying circuit.

What is claimed is:

1. A BTL amplifying circuit having a first output amplifier and a second output amplifier for amplifying input signals having mutually inverted phases and for BTL-driving a load, comprising:

first and second output transistors which are SEPP connected and provided in the first output amplifier;

first and second driving transistors provided in the first output amplifier for driving the first and second output transistors, respectively;

third and fourth output transistors which are SEPP connected and provided in the second output amplifier;

third and fourth driving transistors provided in the second output amplifier for driving the first and second output transistors, respectively;

a first resistor connecting a connection midpoint between the first and second output transistors contained in the first output amplifier and a connection midpoint between the third and fourth driving transistors contained in the second output amplifier; and a second resistor connecting a connection midpoint between the third and fourth output transistors contained in the second output amplifier and a connection midpoint between the first and second driving transistors contained in the first output amplifier.

2. A BTL amplifier circuit according to claim 1, wherein the first output amplifier includes a first input transistor for receiving the input signal to supply output signals to the first and second driving transistors; and a first current source transistor for supplying bias current to the first and second driving transistors, and the second output amplifier includes a second input transistor for receiving the inverted input signal to supply output signals to the third and fourth driving transistors; and a second current source transistor for supplying bias current to the third and fourth driving transistors.

3. ABTL amplifying circuit according to claim 1, further comprising third and fourth resistors connected between the first and second driving transistors; and fifth and sixth resistors connected between the third and fourth driving transistors, the first resistor connecting a connecting point between the first and second output transistors and a connecting point between the fifth and sixth resistors, and the second resistor connecting a connecting point between the third and fourth output transistors and a connecting point between the third and fourth connecting point.

* * * * *

UNITED STATES PATENT AND TRADEMARK OFFICE
CERTIFICATE OF CORRECTION

PATENT NO. : 6,037,839
DATED : March 14, 2000
INVENTOR(S) : Kenichi Kokubo et al.

It is certified that error appears in the above-identified patent and that said Letters Patent is hereby corrected as shown below:

Column 2,
Line 7, after "the" remove "BLT" and insert therefor -- BTL --
Line 49, after "a" remove "BLT" and insert therefor -- BTL --

Column 5,
Line 18, after "point" (first occurrence) remove "a" and insert therefor -- d --

Signed and Sealed this

Seventeenth Day of February, 2004

JON W. DUDAS
*Acting Director of the United States Patent and Trademark Office*